United States Patent [19]

Weiner

[11] Patent Number: 5,569,624
[45] Date of Patent: Oct. 29, 1996

[54] METHOD FOR SHALLOW JUNCTION FORMATION

[75] Inventor: Kurt H. Weiner, San Jose, Calif.

[73] Assignee: Regents of the University of California, Oakland, Calif.

[21] Appl. No.: 464,021

[22] Filed: Jun. 5, 1995

[51] Int. Cl.⁶ .................................................. H01L 21/28
[52] U.S. Cl. ..................... 437/200; 437/161; 437/164; 437/174; 437/907; 437/231; 437/950; 148/DIG. 90
[58] Field of Search ................................. 437/193, 200, 437/152, 160, 161, 164, 173, 174, 907, 908, 950, 929, 231; 148/90

[56] References Cited

U.S. PATENT DOCUMENTS

| | | | |
|---|---|---|---|
| 4,468,853 | 9/1984 | Morita et al. | 437/160 |
| 4,558,507 | 12/1985 | Okabayashi et al. | 437/160 |
| 4,621,411 | 11/1986 | Havemann et al. | 437/164 |
| 4,628,589 | 12/1986 | Sundresan | 437/164 |
| 4,669,176 | 6/1987 | Kato | 437/160 |
| 5,268,317 | 12/1993 | Schwalke et al. | 437/160 |
| 5,401,666 | 3/1995 | Tsukamoto | 437/908 |

FOREIGN PATENT DOCUMENTS 594339  4/1994  European Pat. Off. .

57-194525  11/1982  Japan .

OTHER PUBLICATIONS

"Selective Annealing Utilizing Single Pulse Examiner Laser Irradiation . . . ", H. Tsukamoto et al., Jpn. J. Appl. Phys., vol. 32 (1993), pp. L-967-L-970.

"Fabrication of sub-40-nm p-n junctions for 0.18 μm MOS device applications . . . ", K. H. Weiner et al., SPIE, vol. 2091, pp. 63-70 (1994).

*Primary Examiner*—George Fourson
*Assistant Examiner*—Thomas G. Bilodeau
*Attorney, Agent, or Firm*—Henry P. Sartorio; L. E. Carnahan

[57] ABSTRACT

A doping sequence that reduces the cost and complexity of forming source/drain regions in complementary metal oxide silicon (CMOS) integrated circuit technologies. The process combines the use of patterned excimer laser annealing, dopant-saturated spin-on glass, silicide contact structures and interference effects creates by thin dielectric layers to produce source and drain junctions that are ultrashallow in depth but exhibit low sheet and contact resistance. The process utilizes no photolithography and can be achieved without the use of expensive vacuum equipment. The process margins are wide, and yield loss due to contact of the ultrashallow dopants is eliminated.

19 Claims, 3 Drawing Sheets

METHOD FOR SHALLOW JUNCTION FORMATION

The United States Government has rights in this invention pursuant to Contract No. W-7405-ENG-48 between the United States Department of Energy and the University of California for the operation of Lawrence Livermore National Laboratory.

BACKGROUND OF THE INVENTION

The present invention is directed to the formation of source/drain regions in integrated circuits, particular to the formation of such regions using pulsed laser doping, and more particularly to a doping sequence for forming ultra shallow source/drain junctions through a silicide contact layer using patterned pulsed laser energy.

As lateral dimensions shrink in metal oxide semiconductor (MOS) integrated circuit (IC) technology, it has become increasingly more difficult to fabricate source/drain regions with acceptable electrical characteristics at high yields. Specifically, the source/drain junctions must have very shallow vertical depth (<100 nm), very low sheet and contact resistance, and low reverse bias leakage currents.

Several technologies for shallow junction formation are actively being investigated. These include low energy ion implantation, plasma immersion ion implantation, and rapid thermal diffusion, either from a solid source or the vapor phase. Each of these technologies has its limitations. All require photo-resist masking and high temperature anneals. Implant processes induce damage in the semiconductor crystal and present difficulties when sub-100-nm p-type junctions are desired; whereas rapid thermal diffusions require complex masking layers and very tight control of the wafer temperature and diffusion times. As a result, these technologies make IC processing more complex, the antithesis to the inductries desired goals of process simplification.

Recently excimer laser annealing for MOS devices of less than a quarter micron has been investigated, wherein an excimer laser having a wavelength of 308 nm was utilized to form shallow junctions of depths less than 100 nm. See H. Tsukamoto et al, Selective Annealing Utilizing Single Pulse Excimer Laser Irradiation for Short Channel Metal Oxide Semiconductor Field Effect Transistors, Jpn.J Appli Phys., Vol. 32, pp L967–970, Part 2, No. 713, 15 Jul. 1993.

Also, an alternative deep-submicrometer doping technology is being developed, known as Projection Gas Immersion Laser Doping (P-GILD), which is a more attractive solution to advanced MOS source/drain fabrication, and involves a marriage of lithography and diffusion. P-GILD is a resistless, step-and-repeat doping process that utilizes excimer laser light patterned by a dielectric recticle to selectively heat and, thereby, dope regions of an integrated circuit. See K. H. Weiner et al, Fabrication of Sub-40-nm p-n Junctions for 0.18 µm MOS Device Applications Using a Cluster-Tool-Compatible, Nanosecond Thermal Doping Technique, September 1993. This excimer laser based process eliminates the need for photoresist masking during the doping sequence, saving many steps. Junctions formed by this process are also ideal for deep-submicrometer (<0.1 µm) transistor operation. However, the standard P-GILD process relies on melting of the silicon in the source/drain region to both incorporate and diffuse the impurity or dopant atoms. The melting process may introduce special problems that make the technique hard to integrate seamlessly into standard production technologies. First, when melting the source drain region, it may be difficult not to melt the gate which can result in catastrophic failure of the device. Also, a typical MOS device structure incorporates many thin dielectric films which interfere, optically, with the laser irradiation. If the interference is constructive, a significant amount of energy can be coupled into regions of the device where no energy is actually desired. Again, catastrophic failure of the device can occur. Finally, topology in the region of the melting silicon will tend to self-planarize, again inducing poor device performance. Each of these problems can be addressed, but this requires specific changes in device structure that are not directly related to the doping process. Such changes are difficult to justify economically and also with respect to technology risk.

Thus, it is seen that there is a need in that art to enable the formation of ultrashallow source/drain junctions and which reduces the cost and complexity of forming source/drain regions in MOS integrated circuits. The present invention provides a solution to the above-referenced problems, constitutes a variation of the P-GILD approach, and can be effectively utilized to fabricate source/drain junctions equivalent or superior in performance to alternative technique or superior in performance to alternative techniques with a process and equipment that is much less complex than that used for the or P-GILD or other, more conventional technologies. The fabrication approach of this invention can be integrated seemlessly into standard production processes. No melting processes are used so no changes are required in device structure.

SUMMARY OF THE INVENTION

It is an object of the present invention to provide an improved method for shallow junction formation in IC components.

A further object of the invention is to provide source and drain junctions of a submicron depth using silicided regions and pulsed laser processing.

A further object of the invention is to provide for the formation of utlrashallow source/drain junctions of equivalent or superior performance to those produced by the P-GILD process.

Another object of the invention is to provide a variation of P-GILD process which introduces dopants into the silicon from a deposited glass saturated with the desired dopant species.

Another object of the invention is to provide a method for shallow junction formation wherein the dopants are driven into the silicon through an existing silicide contact layer using laser energy that is sufficient to heat, but not melt, the silicide.

Another object of the invention is to provide an improved method for forming ultrashallow source/drain junctions utilizing a spin-on glass having a controllable thickness, allowing constructive interference of the laser light over the source/drain region and destructive interference over the gate.

Other objects and advantages will become apparent from the following description and accompanying drawings. The present invention is basically a doping sequence that reduces the cost and complexity of forming source/drain regions in MOS integrated circuits. The doping sequence combines the use of patterned excimer laser annealing, dopant-saturated spin-on glass, silicide contact structures and interference effects created by thin dielectric layers to produce source and drain junctions that are ultrashallow in depth (<100 nm) but exhibit low sheet and contact resistance. The doping sequence of this invention uses no photolithography. More specifically, the method of the present invention is a precontacted, solid-source variation of the P-GILD process and introduces the dopants into the silicon from a deposited glass that is saturated with the desired dopant species. The impurities (dopants) are driven into the silicon through an existing silicide contact layer using pulsed laser energy that heats, but does not melt, the silicide. The use of doped spin-on glass having a controlled thickness ensures that no region of the wafer receives more energy than the source/drain regions and that the gate region receives significantly less energy.

BRIEF DESCRIPTION OF THE DRAWINGS

The accompanying drawings, which are incorporated into and form a part of the disclosure, illustrate a doping sequence in accordance with the invention and, together with the description, serve to explain the principles of the invention.

DETAILED DESCRIPTION OF THE INVENTION

The present invention is an improved method for shallow junction formation through silicided regions. The method involves a precontacted, solid source variation of the above-referenced Projection Gas Immersion Laser Doping (P-GILD) process. The method of this invention involves the combined use of spin-on glass as the dopant source, projection GILD to achieve ultrafast, area-selective annealing, doping through a performed silicide layer, and this film interference to maximize absorption over the source/drain regions compared to other regions of the wafers. This method simplifies the source/drain fabrication sequence in metal-oxide-semiconductors (MOS) technologies by: 1) eliminating photoresist mask processing, 2) forming the junctions after contact metallization, and 3) eliminating all vacuum processing during the doping sequence.

Figure 1:
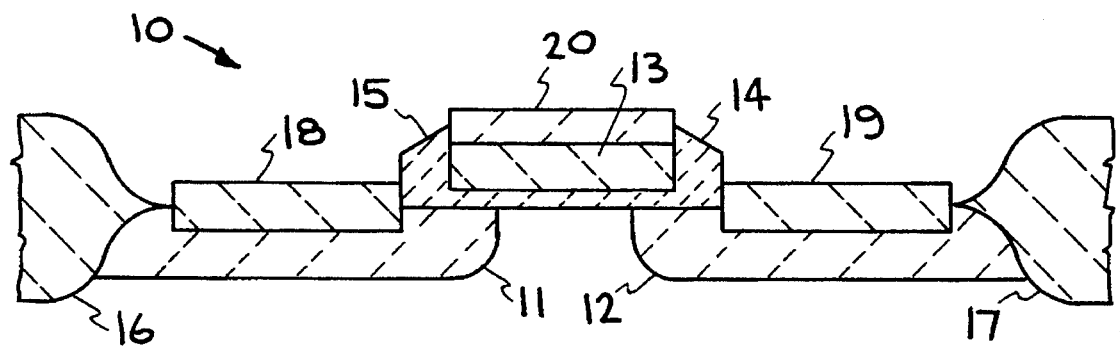
FIGS. 1–4 illustrate in cross-section or schematically an n-type doping sequence in accordance with the invention for shallow junction formation in a − type metal-oxide-semiconductor (NMOS) through silicided regions.
Figure 2:
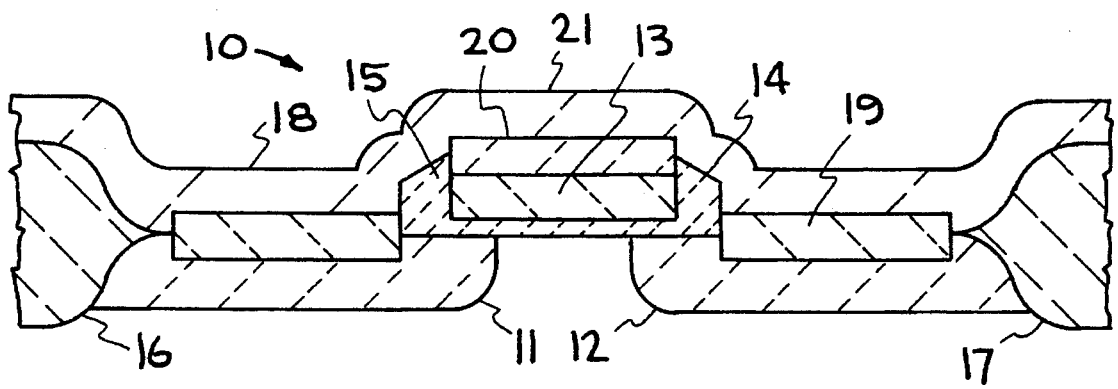
Figure 6:
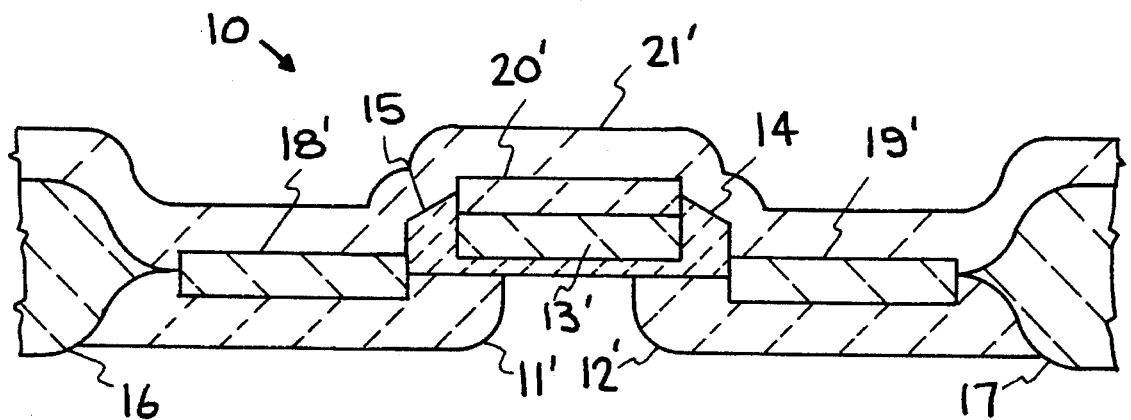
FIGS. 6–7 illustrate in cross-section or schematically a p-type doping sequence, similar to FIGS. 1–3, for shallow junction formation in a + type metal-oxide-semiconductor (PMOS).
Figure 7:
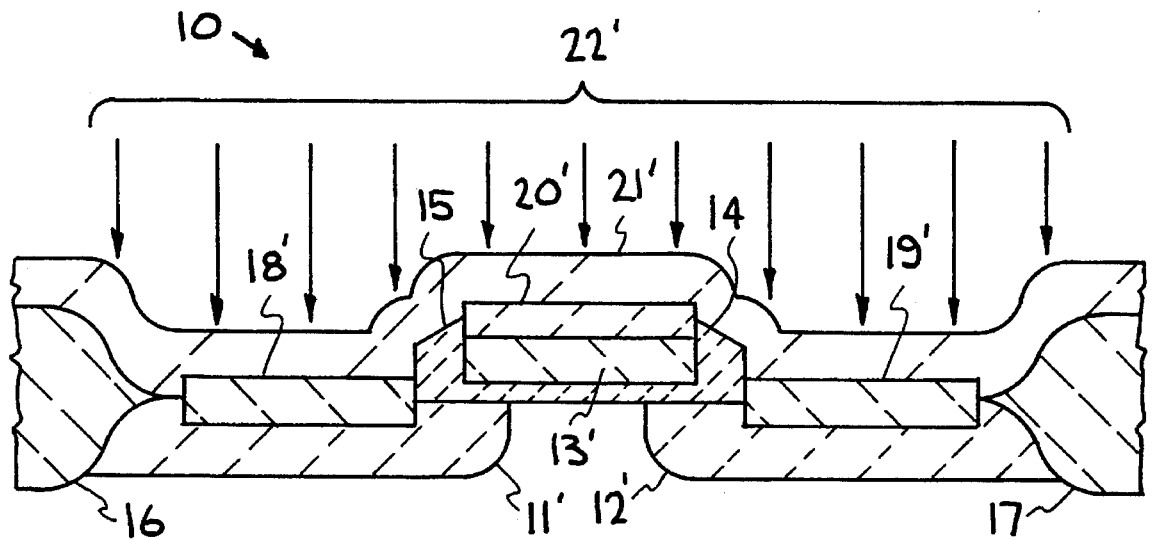
Figure 8:
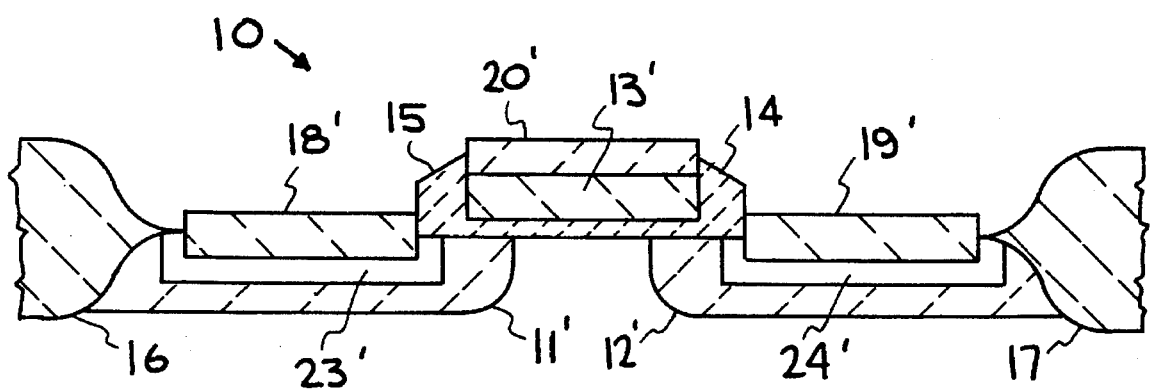
FIG. 8 illustrates a cross-section of a completed PMOS made via the doping sequence of FIGS. 6–7 followed by annealing to drive the p-type dopants into the silicon source/drain regions.

The doping sequence for producing NMOS components is illustrated in FIGS. 1–5, while the doping sequence for producing a PMOS components is partially illustrated in FIGS. 6–8. Referring first to the NMOS components processing, the initial device described in the following method is shown in cross-section in FIG. 1. Up to this point in the state-of-the-art of integrated circuit (IC) process, no specific consideration has been taken for the laser doping step. The device or wafer, generally indicated at 10 includes a source 11 and a drain 12 of an n-LDD (− type Lightly Doped Drain), and a gate 13, with gate 13 being positioned between sidewall spacers 14 and 15, while source 11 and drain 12 extend from contact with a sidewall spacer to an end wall 16 and 17 respectively, of a wafer on which device 10 is fabricated. The source 11 and drain 12 may be composed of silicon, for example, or other materials such as silicon-germanium, gallium-arsenic, and silicon-carbide, while the gate 13 may be composed of polycrystalline silicon for example, or aluminum, molybdenum, and silicon-germanium. As shown in FIG. 1, the source, drain, and gate are each capped by an undoped silicide layer 18, 19, and 20, respectively, typically composed of titanium, tungsten, platinum or cobalt, and having a thickness of 10 to 100 nm. It is recognized that an overall fabrication process may include the formation of the source, drain, gate and silicide layers on a silicon wafer as shown in FIG. 1, for example, or an off-the-shelf device or wafer 10, as illustrated in FIG. 1, may be processed as follows:

1. a heavily n-doped spin-on glass (dielectric, oxide) layer or film 21 is deposited onto the device 10, as shown in FIG. 2. By way of example the n-doped glass layer or film 21 has a ¼ wave thickness and is composed of silicon dioxide ($SiO_2$) and an n-type dopant. The dielectric may also be composed of silicon-nitride, aluminum-oxide, or any other dielectric, either transparent or semi-transparent, in the UV region of the electromagnetic spectrum ($\lambda$ 50 nm$\leq\lambda\leq$380 nm). The n-dopant of glass layer 21 may include arsenic, phosphorous, or antimony. The thickness of the film on layer 21 is preferably: $(2j+1)\times 0.25\times\lambda/n$, where $j=0,1,2,\ldots$, $\lambda$ is the wavelength of the laser light, and n is the refractive index of the dielectric layer 21. The layer or film 21 may be deposited, for example, by alternative techniques including chemical vapor deposition or plasma enhanced chemical vapor deposition. The thickness of the layer 21 is chosen so as to produce constructive interference in the layer and raise the light absorption in the silicide layers 18–20 to the highest level possible.

2. The spin-on glass layer 21 as cured to remove the residual solvents. Curing is accomplished, for example by heating at 100°–400° C. for a period of 1–30 minutes.

Figure 3:
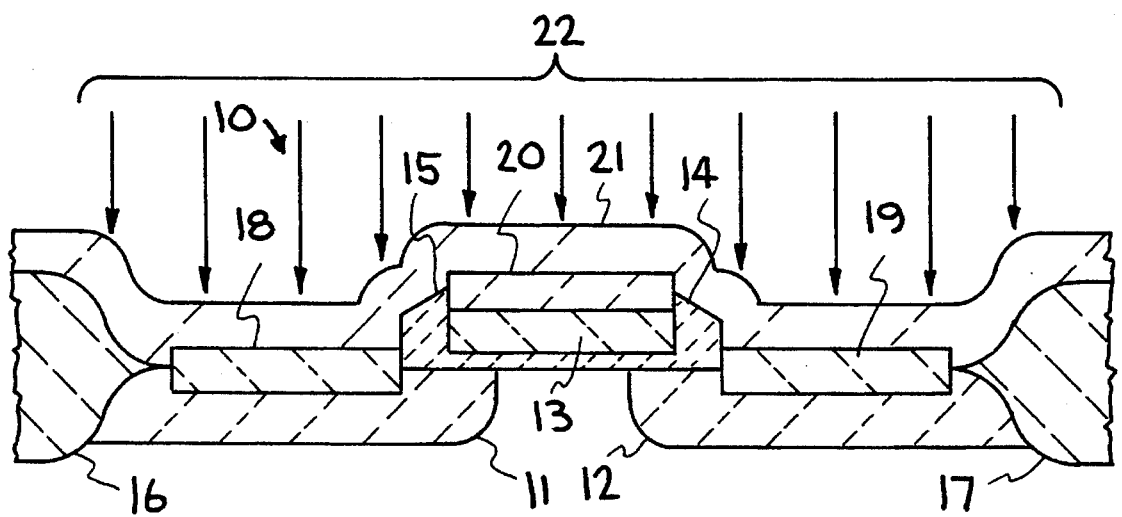
Figure 4:
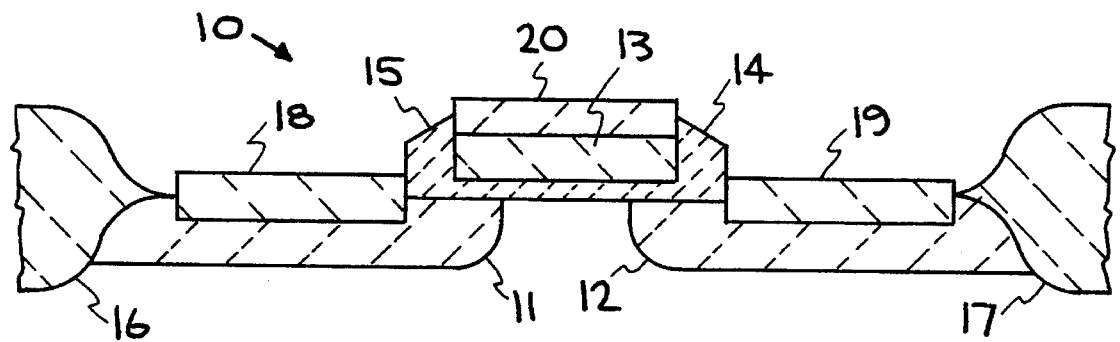
Figure 5:
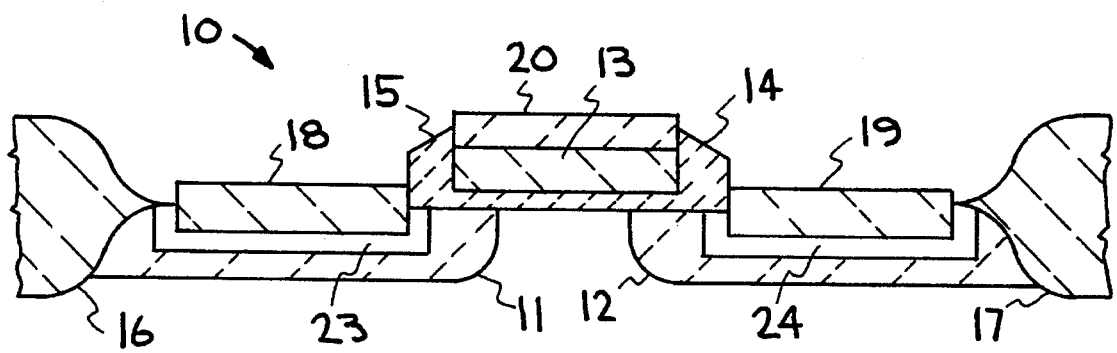
FIG. 5 illustrates in cross-section of a completed NMOS made via the doping sequence of FIGS. 1–4 followed by annealing to drive the n-type dopants from the silicide into the silicon source/drain regions.

3. The spin-on glass layer on film 21 is then annealed by being exposed to a patterned pulsed laser beam, such as an excimer laser beam indicated at 22 in FIG. 3. While the device 10 may have NMOS regions, (FIGS. 1–4) and PMOS regions (FIGS. 6–7), as described hereinafter, only the NMOS regions are exposed during this operational step, as shown in FIG. 3. The exposed regions of the layer 21 absorb the laser light, heating the silicide layers 18–20 to near melting and allowing dopant (impurities) present in the n-doped glass 21 to diffuse into the silicide, such that the silicide layers 18–20 become $N^+$-doped silicide layers. Using multiple (1 to 1000) laser pulses, high levels of dopants can be diffused into the silicide layer 18–20. However, the extremely short (10 to 100 nsec) thermal cycles induced by the pulsed laser (<100 ns) do not allow for diffusion of the dopants from the silicide layers 18–20 into the underlying silicon of the source 11, drain 12, and gate 13. Because the thin, film layer of silicide and the film or layer 21 of doped spin-on glass above the source/drain regions (11 and 12) have been tailored to maximize the amount of energy absorbed no other region in the device 10 can receive more energy, thereby eliminating the problem with anomalous melting due to the thin film interference elsewhere on the device 10. The patterned laser light 22 may be produced, for example, by a pulsed XeCl excimer laser, having an energy fluence of 0.7 to 2.0 J/cm$^2$, and a wavelength of 308 nm. However, other pulsed energy source may be used, such as copper vapor, YAG, and dye lasers 4. Following the laser anneal, as described above, the spin-on glass film or layer 21 is removed as shown in FIG. 4, with the silicide layers 18–20 now being composed of $N^+$-doped silicide, as shown by legend. The removal of the glass layer 21 is carried out by dipping the wafer in a liquid etchant composed of diluted hydrofluoric acid (HF) for a period of time sufficient to completely remove the oxide from the un-laser-annealed region. The high removal rate of the spin-on glass 21 as compared to thermal or densified liquid phase chemical vapor deposition (LPCVD) oxide allows selective removal of only the spin-on glass. One constraint on the etchant is that it does not etch the silicide (layers 18–20).

At this point of the fabrication process, only the silicide for the NMOS components (such as transistors) has been doped. Because heating of the spin-on glass and silicide is achieved selectively using the patterned laser (excimer) energy, none of the n-type dopants diffuse into the silicide over the PMOS components. One caveat to the spin-on glass (oxide) removal process is that the glass over the NMOS components has seen extremely high temperatures and may thus densify. Once densified the etch rate will be more comparable to that of thermal oxide. However, this does not present a problem in the overall processing sequence, as the densified glass (oxide) can be left over the NMOS components and selectively removed from the over the PMOS components because no thermal excursions have been realized in these areas thanks to the patterning of the laser (excimer) light prior to illumination of the substrate.

The doping sequence for PMOS components of the device of FIG. 1, as illustrated in FIGS. 6–7, is generally similar to the sequence described above, and illustrated in FIGS. 2–4 for the NMOS components, and is set forth as follows:

1. A heavily p-doped spin-on glass (dielectric, oxide) layer 21' is deposited onto the device or wafer 10 to cover undoped silicide layers 18', 19', and 20', as shown in FIG. 6, to a thickness, such as ¼ wave, as in the n-doped glass layer 21. The dopant (impurities) for the p-doped glass layer 21' may be composed of boron, gallium, or aluminum. The spin-on glass layer 21' is deposited in the same manner as described above with respect to FIG. 2.

2. The spin-on glass layer 21' is cured as described above to remove the residual solvents.

3. Spin-on glass layer 21' is then annealed by exposure to a patterned pulsed laser energy beam 22', which as produced the by the above described excimer laser, as shown in FIG. 7. The exposed regions of glass layer 21' absorb the laser light, heating the silicide layers 18', 19', and 20' to near melting and allowing the p-type dopant present in the glass layer 21' to diffuse into the silicide, resulting in the layers 18'–20' becoming composed of $P^+$-doped silicide. The etching process may be carried out as described above.

This completes the doping sequence for both the NMOS and PMOS components of the device 10. At this point the device 10 is subjected to a bulk thermal anneal process which drives dopants, both n-type and p-type from the silicide layers (18–19 and 18'–19') into the silicon forming source 11 or 11' and drain 12 or 12', resulting in the formation of thin (<100 nm) junctions or layers 23 and 24 of $N^+$-silicon, see FIG. 8. The junction thickness may vary from about 20 nm to about 100 nm. Note that the dopant from the silicide layer 20 or 20' is not driven into the material of gate 13 or 13' due to the exposure of only silicide layers 18–19 and 18'–19' being subjected to bulk thermal annealing. The bulk thermal annealing may be carried out in a conventional furnace for a period of time between 1–30 minutes at a temperature of 850°–1100° C., or in a rapid thermal annealer at the same temperature but with a cycle time of 1–300 seconds.

It has thus been shown that the invention lies in the combined use of spin-on glass as the dopant source, projection GILD to achieve ultrafast, area-selective annealing, doping through a performed silicide layer, and then film interference to maximize absorption over the source/drain regions compared to other regions of the wafer or device. This invention eliminates photoresist masking and simplifies the source/drain fabrication by forming the junctions after contact metallization, and eliminating all vacuum processing during the doping sequence.

A variation of the fabrication process described above can be used in the case of a technology where the gate silicide (layer 20 or 20') is formed before the source/drain silicide (layers 18–18'/19–19'). This variation involves forming the gate silicide layer on undoped polysilicon, then using a processing sequence similar to that described above, doping the gate silicide only, with an n-type dopant in the NMOS regions and a p-type dopant in the PMOS regions. After removal of the annealed spin-on glass (oxide) is complete, a quarter-wave thickness on the gate, the interference with the laser light goes from constructive to destructive, so the gate absorbs much less energy-than the source/drain regions. This widens the margins for the process significantly.

In a second variation of the method illustrated in FIGS. 1–5 or FIGS. 6–8, the same process step described in FIGS. 1–8 and in the first variation described above can be executed without silicide on the source/drain regions and/or the gate region. Under these circumstances diffusion of the impurities (dopants) is directly into the silicon of the source and drain or the polysilicon of the gate, and the junctions must subsequently be connected by some means.

The present invention can be utilized by manufacturers of integrated circuits within their fabrication cycle to reduce the complexity and, thereby the cost of production. Manufactures of silicon-TFT-based active matrix substrates for high performance active matrix liquid crystal displays may also use this process to reduce the cost and complexity, while increasing the performance of the product.

While specific doping sequences, materials, parameters, etc. have been illustrated and/or described, to exemplify and set for the principles of the principles of the present invention, such are not intended to be limiting. Modifications and changes may become apparent to those skilled in the art, and it is indicated that the invention only be limited by the scope of the appended claims.

What is claimed is:

1. Improved method for shallow junction formation in at least the source/drain regions of an integrated circuit, comprising:

providing at least the source and the drain regions with a layer of undoped silicide, depositing a layer of doped dielectric material on at least the layer of undoped silicide, directing patterned pulsed laser energy onto the doped dielectric material covering at least the source and drain causing dopant in the dielectric material to diffuse into the silicide, removing the dielectric material, and annealing at least the silicide over the source and drain regions to drive dopant from the silicide to form junctions of doped material having a thickness of less than 100 nm in the source and drain regions.

2. The improved method of claim 1, additionally including curing the doped dielectric material prior to directing patterned pulsed laser energy thereonto.

3. The improved method of claim 1, additionally including forming the source/drain regions of a material selected from the group consisting of silicon, silicon-germanium, silicon-carbide, and gallium-arsenide.

4. The improved method of claim 1, additionally including forming the undoped silicide from a material selected from the group consisting of titanium, tungsten, platinum, and cobalt.

5. The improved method of claim 1, additionally including forming the doped dielectric material from a material selected from the group consisting of silicon dioxide, silicon nitride, aluminum oxide, and any dielectric either transparent or semi-transparent in the ultraviolet region of the electromagnetic spectrum 50 nm$\leq \lambda \leq$380 nm).

6. The improved method of claim 1, wherein the doped dielectric material is selected from the group consisting of material containing n-type dopants and material containing p-type dopants.

7. The improved method of claim 1, wherein the doped dielectric material is deposited to a thickness capable of producing constructive interference and raising light absorption in the silicide during the pulsed laser step.

8. The improved method of claim 1, wherein the doped dielectric material is deposited to the thickness of $(2j+1) \times 0.25 \times \lambda/n$, where j is an integer greater than or equal to zero, $\lambda$ is the wavelength of the laser light, and n is the refractive index of the dielectric material.

9. The improved method of claim 1, wherein the patterned pulsed laser energy is produced by an excimer laser.

10. A method of forming submicron junctions in at least the source and drain regions of a metal-oxide-semiconductor having a layer of silicide over at least the source and drain regions, comprising;

depositing a layer of doped spin-on glass on at least the layer of silicide over the source and drain regions;

curing the thus deposited layer of doped spin-on glass;

directing patterned pulsed energy onto at least the layer of doped spin-on glass over the source and drain regions, causing heating of the silicide and allowing dopant in the spin-on glass to diffuse only into the silicide; and annealing the source and drain regions, causing the dopants in the silicide to be driven into the source and drain regions forming a junction therein of a thickness less than 100 nm.

11. The method of claim 10, additionally including removing the spin-on glass prior to annealing the source and drain regions.

12. The method of claim 10, wherein the doped spin-on glass is selected from the group consisting of n-type doped spin-on glass and p-type doped spin-on glass.

13. The method of claim 12, wherein one of the n-type and p-type doped spin-on glass is first deposited on certain areas of the silicide and then irradiated by the patterned pulsed energy, whereafter the other of the n-type and p-type doped spin-on glass is deposited on certain other areas of the silicide, and then irradiated by the patterned pulsed energy, whereafter the annealing of the source and drain regions is carried out.

14. The method of claim 13, additionally including removing the one of the n-type and p-type doped spin-on glass prior to depositing the other of the n-type and p-type doped spin-on glass.

15. The method of claim 10, wherein the patterned pulsed energy is produced by a pulsed excimer laser.

16. In a process for producing a metal-oxide semiconductor having a source, drain and gate covered by silicide, the improvement comprising:

depositing doped spin-on glass on the silicide, curing the deposited doped spin-on glass, irradiating the deposited doped spin-on glass with patterned pulsed laser energy, causing doping of the silicide, removing the spin-on glass, and thermally annealing at least the source and drain thereby forming submicron junctions in the surface of the drain and source adjacent the silicide.

17. The improvement of claim 16, additionally including forming the doped spin-on glass to include a dopant selected from n-type and p-type dopants.

18. The improvement of claim 17, wherein n-type doped spin-on glass and p-type doped spin-on glass are deposited on different areas of the silicide, whereby irradiation thereof causes n-doped and p-doped silicide areas.

19. A method for forming sub-micron junctions in the source and the drain of an MOS, comprising:

forming a silicide on an undoped polysilicon gate, depositing a first layer of doped dielectric material on the silicide, curing the first layer of doped dielectric material, irradiating the first layer of doped dielectric material with patterned pulsed laser energy, causing doping of the silicide, removing the first layer of dielectric material, depositing a second layer of doped dielectric material on the source and drain areas, depositing a layer of undoped dielectric material on the doped silicide, patterning the undoped dielectric material, irradiating the second layer of doped dielectric material with patterned pulsed laser energy, causing doping of the source and drain area, removing the second layer of dielectric material, and annealing at least the source and drain areas, resulting in the formation of junctions in the source and drain areas of a thickness less than 1 micron.

\* \* \* \* \*